United States Patent [19]

Ferrari et al.

[11] Patent Number: 4,739,378
[45] Date of Patent: Apr. 19, 1988

[54] PROTECTION OF INTEGRATED CIRCUITS FROM ELECTRIC DISCHARGE

[75] Inventors: Paolo Ferrari, Gallarate; Franco Bertotti, Milan, both of Italy

[73] Assignee: SGS Microelettronica S.p.A., Catania, Italy

[21] Appl. No.: 15,650

[22] Filed: Feb. 17, 1987

[30] Foreign Application Priority Data

Feb. 18, 1986 [IT] Italy ............................. 19449 A/86

[51] Int. Cl.$^4$ ............................................. H01L 29/90
[52] U.S. Cl. ............................................ 357/13; 357/20; 357/23.13; 357/40; 357/89; 361/56; 361/91
[58] Field of Search .................. 357/20, 13, 40, 48, 357/89, 23, 13; 361/56, 91

[56] References Cited

U.S. PATENT DOCUMENTS

| 4,405,933 | 9/1983 | Avery | 357/13 |
| 4,451,839 | 5/1984 | Nelson | 357/13 |
| 4,631,562 | 12/1986 | Avery | 357/48 |
| 4,651,178 | 3/1987 | Avery | 357/40 |

FOREIGN PATENT DOCUMENTS

| 1549324 | 11/1968 | France | 357/13 |
| 59-198768 | 11/1984 | Japan | 357/13 |
| 8203862 | 5/1983 | Netherlands | 357/13 |
| 2113907 | 8/1983 | United Kingdom | 357/13 |
| 2130792 | 6/1984 | United Kingdom | 357/13 |
| 2149205 | 6/1985 | United Kingdom | 357/13 |

Primary Examiner—Joseph E. Clawson, Jr.
Attorney, Agent, or Firm—Pollock, Vande Sande & Priddy

[57] ABSTRACT

Described is an integrated semiconductor structure for the protection from electrical discharges of electrostatic origin of particularly sensitive components of an integrated circuit. The structure is almost entirely formed directly underneath a particular input pad thus requiring a minimum useful area and is characterized by very high damaging voltage and speed of intervention because of the extremely low series resistance of the two zener junctions constituting the structure.

3 Claims, 1 Drawing Sheet

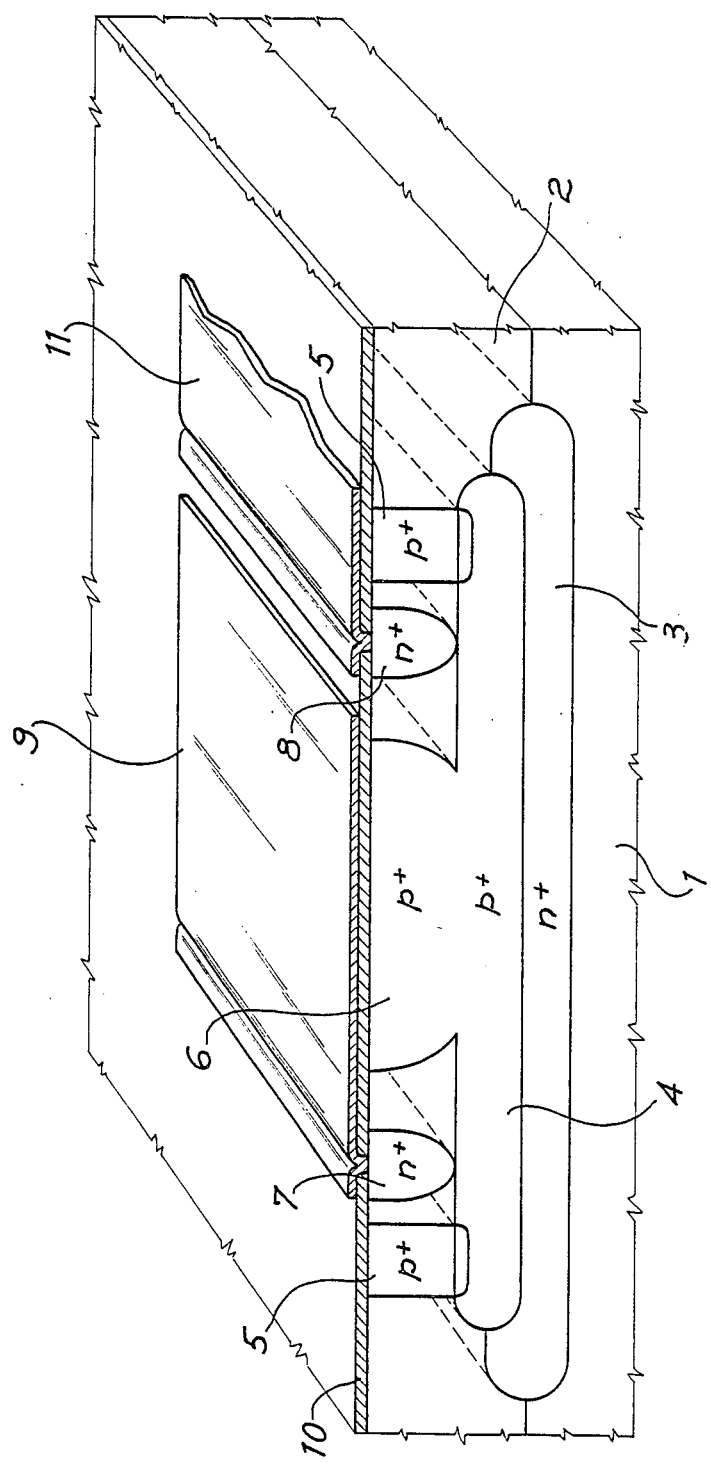

PROTECTION OF INTEGRATED CIRCUITS FROM ELECTRIC DISCHARGE

The present invention relates, in general, to integrated semiconductor devices or circuits and, more in particular, to an integrated structure for protecting the active and/or passive components of the device from the possibility of being accidentally damaged by discharges of electrostatic origin during the fabrication steps, assembling and handling of the integrated circuit or device itself.

The extraordinary technological advances in the field of fabrication of integrated circuits (IC) such as ion implantation, ion beam etching, definition of areas by electron beam, have permitted the density of integration to be increased as well as the performances of the single components, however, they have contemporaneously determined very often a greater sensitivity of some of these to damages caused by accidental electric discharges of electrostatic origin.

In this connection it is known that floors, glasses, containers for the transfer of the wafers, plastic bags and tubes for transferring and handling pieces are all highly dangerous materials because of the potentials which they may reach (up to 30 kV).

Furthermore, the operator himself, during manual handling, may induce a discharge of non-negligible value.

Thus the use of particular antistatic material for flooring, bench tops, floor and table covers which insure a continous drainage of electrical charges by dispersing them toward ground, as well as the use of antistatic transfer tubes and antistatic bracelets for removing any charge from the operators, is indispensable for preventing generation of discharges of high intensity.

However, even a most sophisticated antistatic protection system is insufficient to prevent accidental damages especially in cases of particularly sensitive components which already show failures with voltages (Vdam) in the order of 100–400 V. In these instances a circuital intervention becomes necessary, moreover, even intrinsically sturdy structures, if handled in an environment not particularly studied for preventing triboelectric effects, may also be subject to failures.

From the point of view of specific resistance to failure from electrostatic discharge, each type of device presents its own peculiar range of voltages beyond which the discharge, by a voltage effect in MOS type devices or by a current effect in bipolar type devices, causes failure or degradation.

With large scale integration and therefore with ever smaller geometries the problem, originally limited to the field of MOS devices, has presented itself also in the field of bipolar type integrated circuits and naturally also in the so-called mixed processes which realize, on the same monolithic substrate, MOS type and bipolar type components.

Electrostatic discharges investing base-emitter junctions in small area transistors may cause their failure, as well as they may cause failure of the thin layer of gate oxide in MOS type components as well as in integrated capacitors.

In bipolar type integrated circuits, the problem, whose incidence is invaluable for some processes in terms of a 2% drop of the yield, has been tackled, particularly in instances wherein the damaging voltage (Vdam) results relatively small, by using protection structures in the integrated circuits with function, generally, of a limiting diode, respectively, toward ground and/or toward the supply node.

In the publication titled "Electrostatic Discharge Protection in Linear IC's" by Marisa Manzoni, presented at the ICCE-International conference on Consumer Electronics in Chicago, Ill., USA on June 5–7, 1985, the above mentioned technical problem and various known types of protection structures, utilized in linear type integrated circuits are analyzed from the point of view of their effectiveness or sturdiness as well as of their area requirement and of their speed of intervention, quantified in terms of the RC constant measured between the input and ground pins.

The content of said publication is herewith incorporated by expressed reference.

The circuital expedients of the prior art, analyzed and commented in said publication, present some drawbacks.

A first drawback is represented by the fact that the various protection structures of the prior art require, in almost every case, a non-negligible area for their implementation in the integrated circuit. A second negative aspect is due to the fact that B-E and B-C zener junctions as well as the double SCR structures and other structures derived from the structures of integrated transistors, normally have series resistances in the order of several hundred ohms (typically 400–500 ohms). This fact, besides limiting the value of the damaging voltage (Vdam) obtainable by means of the particular structure, has a negative effect also on the speed of intervention.

It is an object of the present invention to provide an improved integrated structure of protection from electrostatic discharge. The integrated semiconductor structure of the present invention for the protection from electic discharges of electrostatic origin of components of an integrated circuit, comprising a single crystal substrate of semiconductor material and an epitaxially grown layer on said substrate wherein said circuital components are formed, is characterized in that it comprises two zener junctions between a buried region obtained by ion implantation and epitaxial growth and having a high doping level of an impurity of a first type of conductivity, this buried region being isolated from the semiconductor material of substrate by a bottom isolation buried layer doped with an impurity of a second type of conductivity and, respectively, two distinct diffused regions of high doping level of an impurity of said second type of conductivity, said two distinct diffused regions being isolated one from the other and from other regions of said epitaxially grown layer by isolation diffused regions of high doping level of an impurity of said first type of conductivity connected to said buried region;

one of said two distinct diffused regions being electrically connected to a pad of the integrated circuit and the other being electrically connected to a metallization layer constituting a common potential node of said integrated circuit.

Advantageously the whole structure, or anyway a substantial portion of it, is formed in the epitaxially grown layer in a zone directly underneath the metallized area constituting said pad (i.e. the metallized area onto which is welded the wire for the electrical connection to the respective sector of the metal frame for assembling and supporting the integrated circuit.

In this way, the area required for integrating the protection structure of the invention, in excess of the area unrelevant to the economy of the process, that is the area directly underneath the projected area of the pad, is of only a few mil$^2$ (mil=thousands of inch=0.024 mm). Moreover the two zener junctions, i.e. the combination of the two zener diodes, presents an extremely low series resistance because the buried layer and the two distinct diffused regions are all relatively highly doped regions with extremely low resistivity characteristics.

Purely for illustrative and non-limitative purposes, and with the aim of making more easily understood the invention and its advantages, the description now proceeds with an illustration of a particularly preferred embodiment making reference to the annexed drawing showing, though in a schematic way, a perspective view in section of the integrated structure of the invention.

Referring to the FIGURE, the device in question is made on a p$^-$ silicon substrate 1, preferably constituted by a slice of crystallographic orientation <100> having a bulk resistivity comprised between 1 and 5 ohms.cm, onto which a layer of n$^-$ silicon 2, having a resistivity comprised between 1 and 3 ohms.cm, is grown epitaxially.

According to the known techniques of implantation, partial diffusion and of epitaxial growth, in a location directly underneath the area onto which a particular input pad of the integrated circuit will be made, are formed an n$^+$ bottom isolation buried layer 3 (bottom-n-well) and a p$^+$ buried region 4 substantially superimposed to said n$^+$ buried layer of bottom isolation. The p$^+$ buried region 4 is doped with boron and has a surface resistivity comprised preferably between 50 and 100 ohms/square.

Deep diffusions of boron, forming the respective p$^+$ isolation regions 5 and 6, provide a perfect isolation of the two zener junctions which are formed by diffusing phosphorus to make the two distinct n$^+$ regions 7 and 8 deep enough to reach the buried p$^+$ region 4.

As shown in the FIGURE, the cathode of one of the two diodes (region 7) is connected to the metallization layer 9 of the pad of the integrated circuit along an edge of it through a suitable opening through the thermally formed layer of insulating oxide 10 present on the surface of the epitaxially grown layer of silicon, while the cathode of the second diode (region 8) is connected to the metallization layer 11 of ground or of another common potential (i.e. supply) of the integrated circuit through a suitable opening in the layer of insulating oxide 10.

The p$^+$ silicon of the isolation diffusions 5 and 6, as well as the n$^+$ silicon of the cathode diffusions 7 and 8 of the two zener diodes, has a surface resistivity comprised preferably between 0.8 and 1.2 ohms/square.

In linear integrated circuits applications with pad dimensions of about 125 micrometers by 125 micrometers, the protection structure of the invention formed in accordance to the preferred embodiment described above, presents a series resistance generally comprised between 50 and 100 ohms.

Moreover the useful surface occupied may be evaluated to be about 10 mil$^2$ (0.25 mm$^2$).

Through tests, conducted in accordance with standard specifications, on linear devices fabricated according to processes designed for supply voltage of 18 volts and utilizing small area NPN or PNP transistors in input stages, it has been observed that the greater sensitivity is shown from the B-E junction when the impulse reverse biases the junction and the failure mechanism appears to be typically the melting of silicon caused by localized overheating in the depletion region of the junction.

Under these conditions the value of the damaging voltage may be of about 400 V.

If the same device is provided with the protection structure of the present invention, an increase of the damaging voltage to about 3000-9000 V is observed.

The integrated protection structure of the invention is compatible with a large number of fabrication processes for integrated circuits containing bipolar type and/or MOS type and/or complementary DMOS type components.

A process for fabricating the integrated structure of protection object of the present invention comprises the following steps:

implantation and diffusion of phosphorus on the surface of a starting substrate of p or p$^-$ silicon, doped with boron, to form the bottom isolation n$^+$ buried layer 3 (bottom-n-well), (in this step of fabrication will normally be formed also the so-called implanted sinkers of NPN transistors and the bottom-n-well of vertical PNP transistors with isolated collector);

boron implantation on the area where the p$^+$ silicon region 4 corresponding to the anode of the two diodes will be formed, (in this step the boron implantations for making the various bottom isolation regions will also be made);

epitaxial growth of a layer of n$^-$ silicon 2;

deposition of boron and diffusion for making the p$^+$ isolation diffusions 5 and 6 for isolating the two cathodes of the diodes (in this step the depositions and diffusions of boron for forming the top isolation diffusions will also be performed);

deposition of phosphorus and diffusion for forming the n$^+$ cathode regions of the two diodes, respectively 7 and 8, (in this step sinker diffusions will also be made).

As it will be easily understood by the expert of the field, the fabrication process of the structure of the invention may also be modified by varying, for example, the conditions and/or the procedures of the various treatments contemplated by the process itself for adapting them to particular requirements and restraints of design and fabrication.

Of course the protection structure of the invention is applicable to input pads as well as to output pads of the integrated circuit provided that the normal output voltages of the circuit be lower than the zener voltage of the diodes. Moreover the structure may also be duplicated for each single pad for providing a protecting limiting diode both toward ground potential as well as toward the supply potential. In this instance the projected area of the pad may be shared by the two distinct structures. Each one will be connected to the respective common potential node (metallization) of the integrated circuit.

What we claim is:

1. A semiconductor integrated structure for protecting from electrical discharges of electrostatic origin components of an integrated circuit, comprising a single crystal substrate of semiconductor material and a layer epitaxially grown on said substrate wherein said circuital components are formed, characterized by comprising two zener junctions between a buried region, heavily doped with an impurity of a first type of conductivity, isolated from the semiconductor material of the substrate by a bottom isolation buried layer doped with an impurity of a second type of conductivity and, respectively, two distinct diffused regions heavily doped with an impurity of a second type of conductivity;
   said two distinct diffused regions being isolated one from the other and from other regions of said epitaxially grown layer by isolation regions, heavily doped with an impurity of said first type of conductivity, connected to said buried region;
   one of said diffused regions being electrically connected to a pad of the integrated circuit and the other being electrically connected to a metallization layer constituting a common potential node of said integrated circuit.

2. The structure of claim 1 being formed, substantially, in the epitaxially grown layer directly underneath a metallized area constituting said pad.

3. A semiconductor integrated circuit comprising a monocrystalline semiconductor substrate and a layer epitaxially grown on said substrate wherein a plurality of circuital components are formed, some of which being directly connected to pads destined for the connection of leads, characterized in that in a region directly underneath the area of at least one of said pads there is a protection structure against discharges of electrostatic origin formed by two zener junctions between a buried region, heavily doped with an impurity of a first type of conductivity, isolated from the substrate by a bottom isolation buried layer doped with an impurity of a second type of conductivity and, respectively, two distinct diffused regions heavily doped with an impurity of a second type of conductivity;
   said two distinct diffused regions being isolated one from the other and from other regions of said epitaxially grown layer by isolation regions, heavily doped with an impurity of said first type of conductivity, connected to said buried region;
   one of said diffused regions being electrically connected to said pad of the integrated circuit and the other being electrically connected to a metallization layer constituting a common potential node of said integrated circuit.

* * * * *